(12) United States Patent
Tsironis

(10) Patent No.: US 11,038,249 B1
(45) Date of Patent: Jun. 15, 2021

(54) HARMONIC HYBRID ELECTRONIC LOAD PULL TUNER

(71) Applicant: Christos Tsironis, Dollard-des-Ormeaux (CA)

(72) Inventor: Christos Tsironis, Kirkland (CA)

( * ) Notice: Subject to any disclaimer, the term of this patent is extended or adjusted under 35 U.S.C. 154(b) by 0 days.

(21) Appl. No.: 16/698,424

(22) Filed: Nov. 27, 2019

Related U.S. Application Data

(60) Provisional application No. 62/772,829, filed on Nov. 29, 2018.

(51) Int. Cl.
*H01P 5/04* (2006.01)
*H03H 7/38* (2006.01)
*G01R 27/32* (2006.01)
*H03H 7/40* (2006.01)

(52) U.S. Cl.
CPC ............... *H01P 5/04* (2013.01); *G01R 27/32* (2013.01); *H03H 7/383* (2013.01); *H03H 7/40* (2013.01)

(58) Field of Classification Search
CPC ........... H01P 5/04; G01R 27/32; H03H 7/383; H03H 7/40
See application file for complete search history.

(56) References Cited

U.S. PATENT DOCUMENTS

| | | |
|---|---|---|
| 5,276,411 A | 1/1994 | Woodin et al. |
| 7,282,926 B1 | 10/2007 | Verspecht et al. |
| 8,497,689 B1 | 7/2013 | Tsironis |
| 9,921,253 B1 | 3/2018 | Tsironis |

OTHER PUBLICATIONS

"A New Load-pull Characterization Method for Microwave Power Transistors," Y. Takayama, [online], 1976 IEEE Microwave Theory & Techniques Society (MTT-S) International Microwave Symposium, pp. 218-220. [Retrieved on Apr. 6, 2017]. Retrieved from Internet <URL: http://ieeexplore.ieee.org/ document/ 1123701/>.
"ALPS-308, Active Load Pull System for PCN Applications", Product Note 33, Focus Microwaves, Apr. 1966, p. 3, Figure 3.
"Computer-Aided Error Correction of Large-Signal Load-Pull Measurements", Tucker, R.S. and Br Adley P., [online], IEEE Transactions on Microwave Theory and Techniques, vol. MTT-32, No. 3, Mar. 1984, pp. 296-300. [Retrieved Apr. 6, 2017]. Retrieved from Internet < URL:http://ieeexplore.ieee.org/document/ 1132668/>.

(Continued)

*Primary Examiner* — Samuel S Outten

(57) ABSTRACT

A wideband hybrid harmonic high-speed impedance load pull tuner uses the active loop feedback technique combined with transmission type electronic tuner in the active feedback loop and electro-mechanical slide screw harmonic pre-matching tuning. The tuner allows millisecond two or three harmonic tuning with maximum Gamma close to 1 using reduced feedback injection power compared to purely active systems. The system is pre-calibrated and allows fast precision tuning even under nonlinear feedback amplifier power conditions when operated with in-situ wave measurement. Using wideband power dividers, instead of band-limited circulators, to convert the reflection electronic tuner into a transmission amplitude and phase modulator, allows multi-harmonic hybrid operation.

9 Claims, 16 Drawing Sheets

(56) References Cited

OTHER PUBLICATIONS

"Comparison of Active Versus Passive On-wafer Load-pull Characterization of Microwave and Millimeter-wave Power Devices," J. E. Muller and B. Gyselinckx, [online],1994 IEEE MTT-S Digest, CH3389-4/94/0000-1007$01.00, pp. 1007-1080, Figure 1, [Retrieved Apr. 6, 2017]. Retrieved from Internet < URL: http://ieeexplore.ieee.org/iel5/1100/7886/00335168.pdf>.

"MPT a universal multi-purpose tuner", Product Note 79, Focus Microwaves, 2004.

"Multi Port Measurements", presentation by, D. Blackham and K.Wong, Agilent Technologies. pp. 3-8.

"Overcoming nonlinear measurement challenges", Application Note, Tektronix corporation.

"Wilkinson Power Divider PD-0109", Data Sheet [online], Marki Microwave [retrieved on Nov. 14, 2018], Retrieved from Internet <URL: https://www.markimicrowave.com/Assets/datasheets/PD-0109.pdf>.

SP6T Electro-mechanical switch-Open Ports Terminated, model V3-7-L, Datasheet [online], Microwave Communications Laboratories, Inc. [retrieved on Nov. 14, 2018], Retrieved from Internet <URL: https://mcli.com/documents/V3-7-L.pdf>.

"Single Junction Circulators, D3C2080", Datasheet [online], Ditom Corp., [retrieved on Nov. 14, 2018], Retrieved from Internet <URL https://www.ditom.com/images/D3C2080.pdf>.

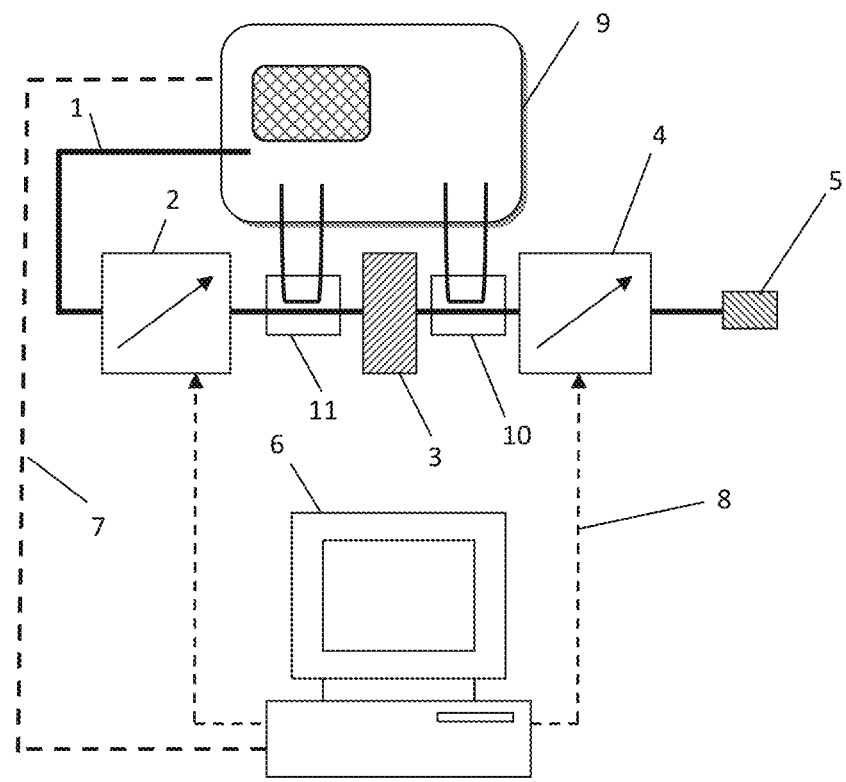
FIG. 1: Prior art

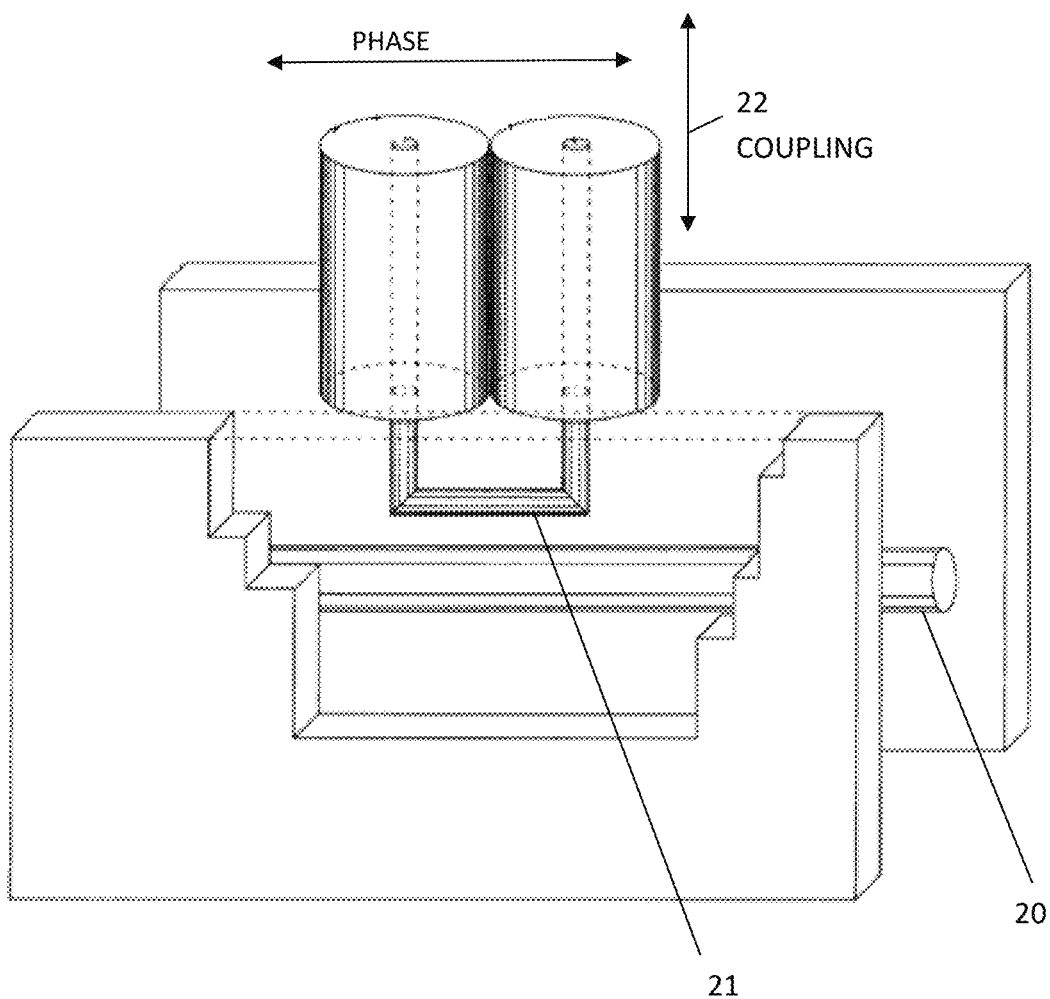
FIG. 2: Prior art

FIG. 3A: Prior art
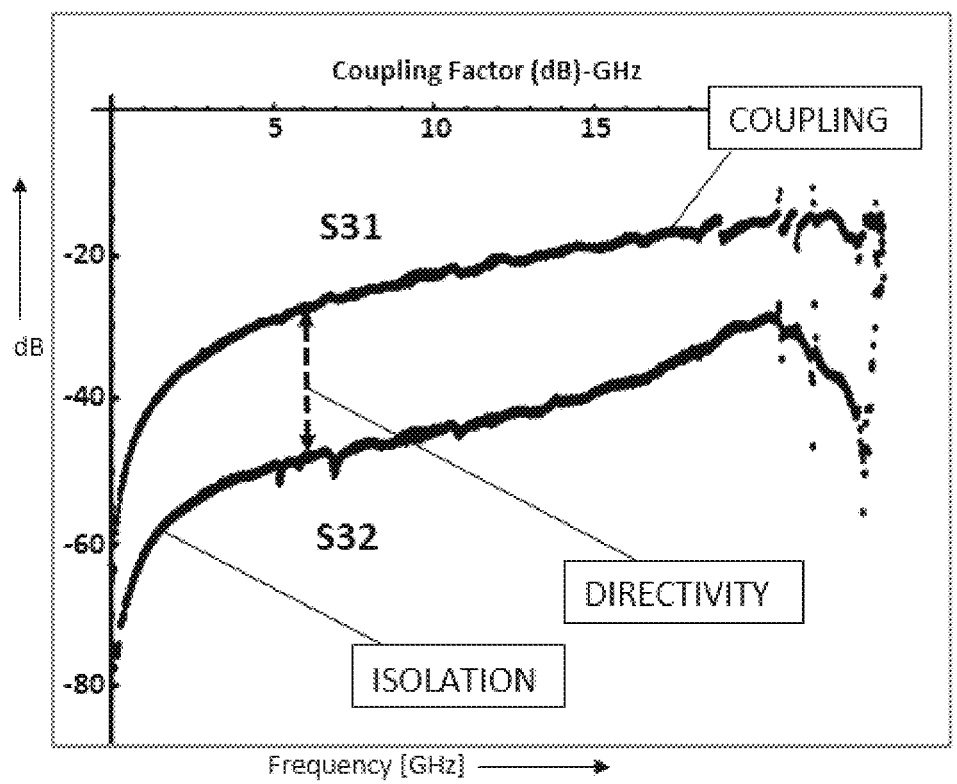
FIG. 3B: Prior art
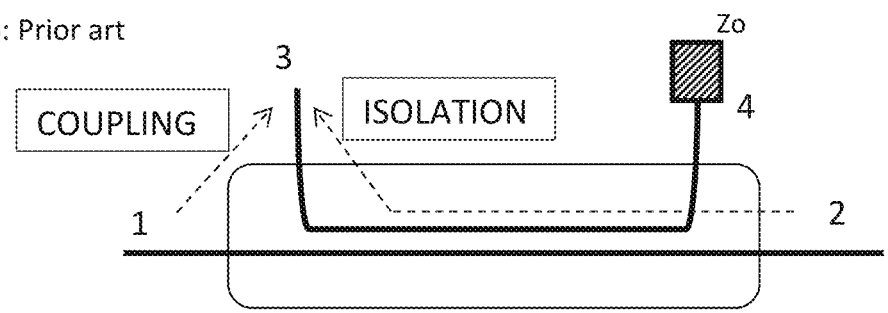

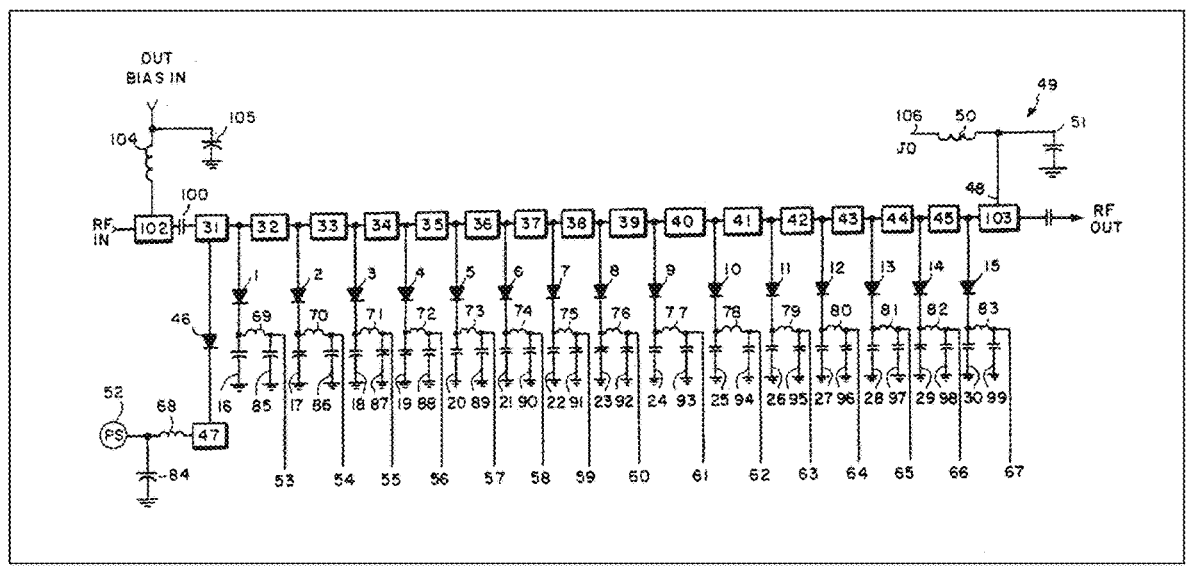
FIG. 4: Prior art

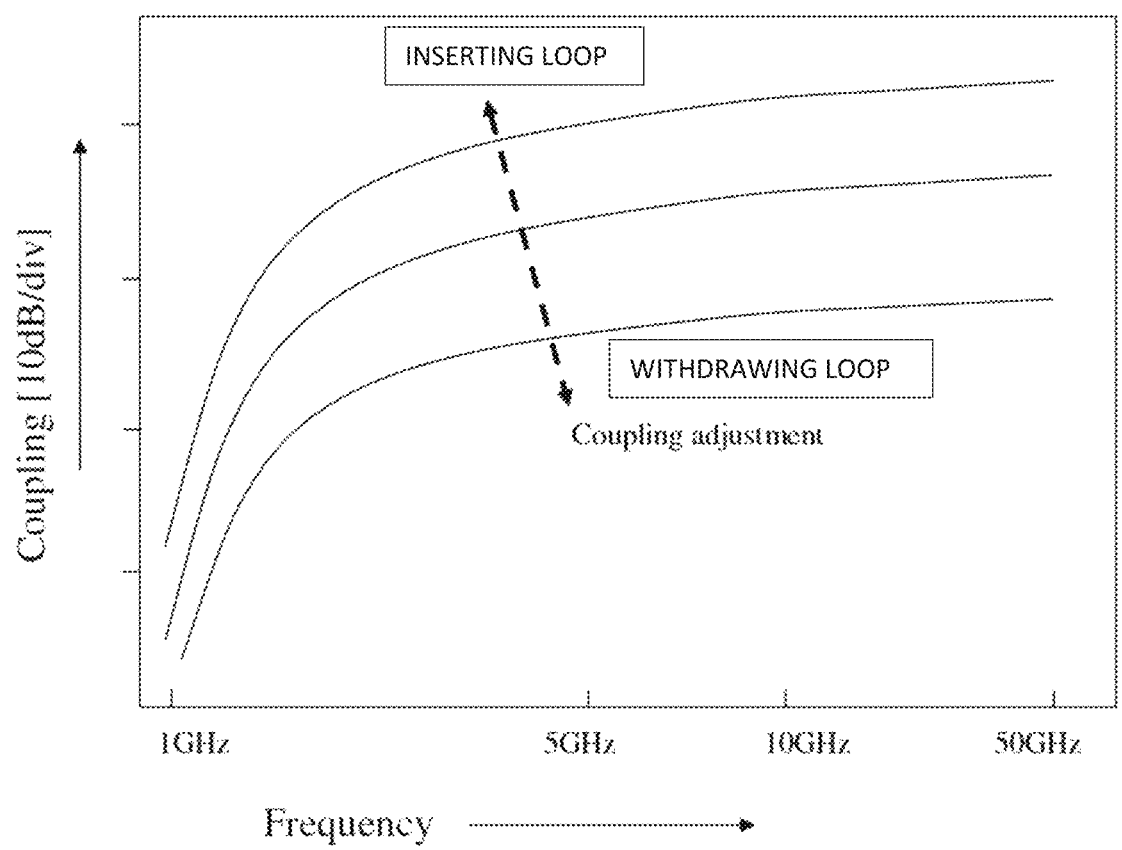
FIG. 5: Prior art

FIG. 12A
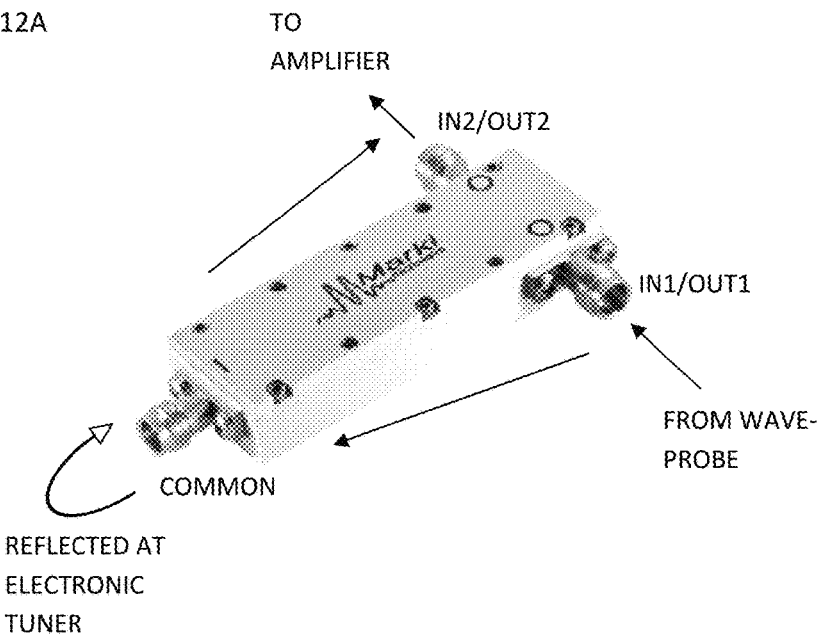
FIG. 12B
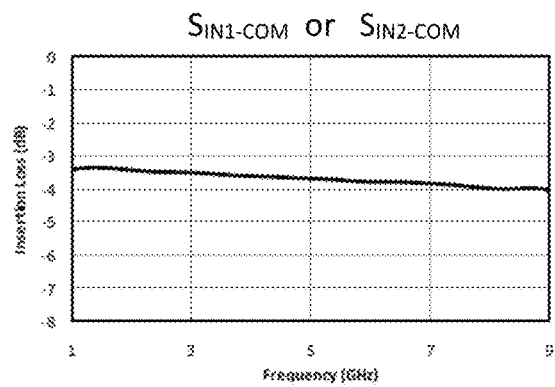 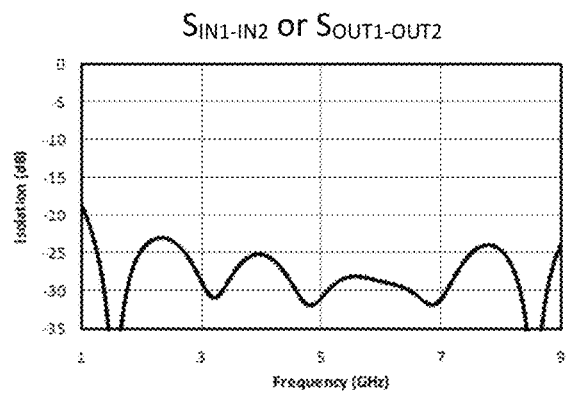

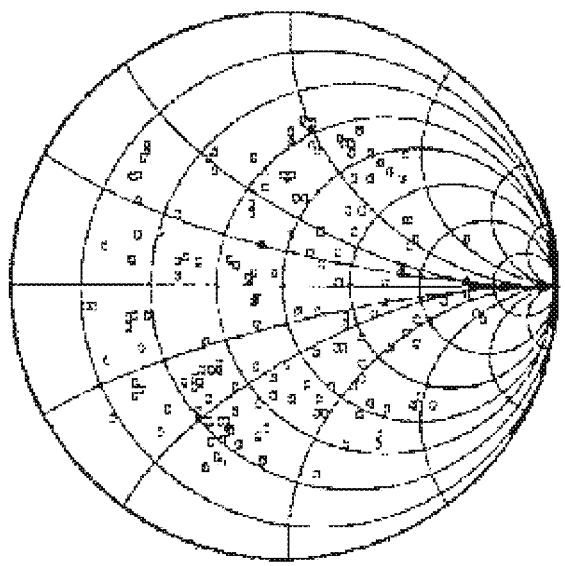
FIG. 13A: Prior art
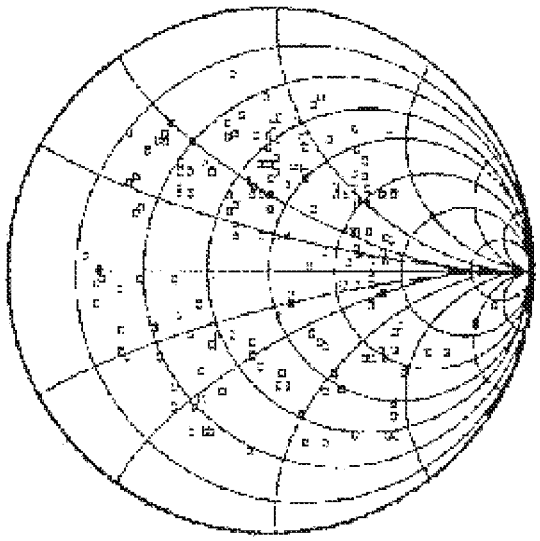
FIG. 13B: Prior art
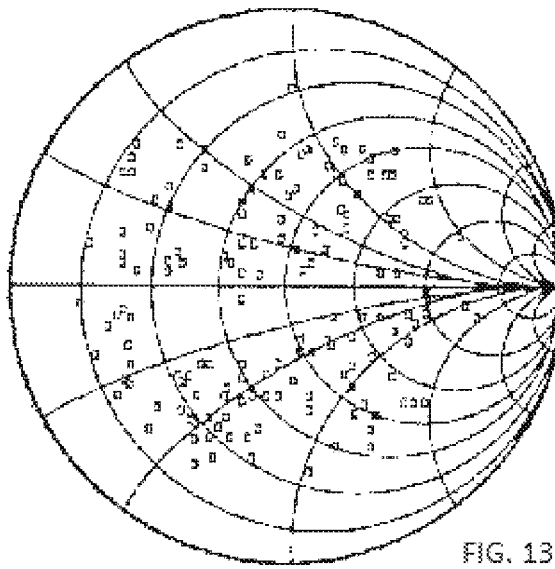
FIG. 13C: Prior art FIG. 15 A
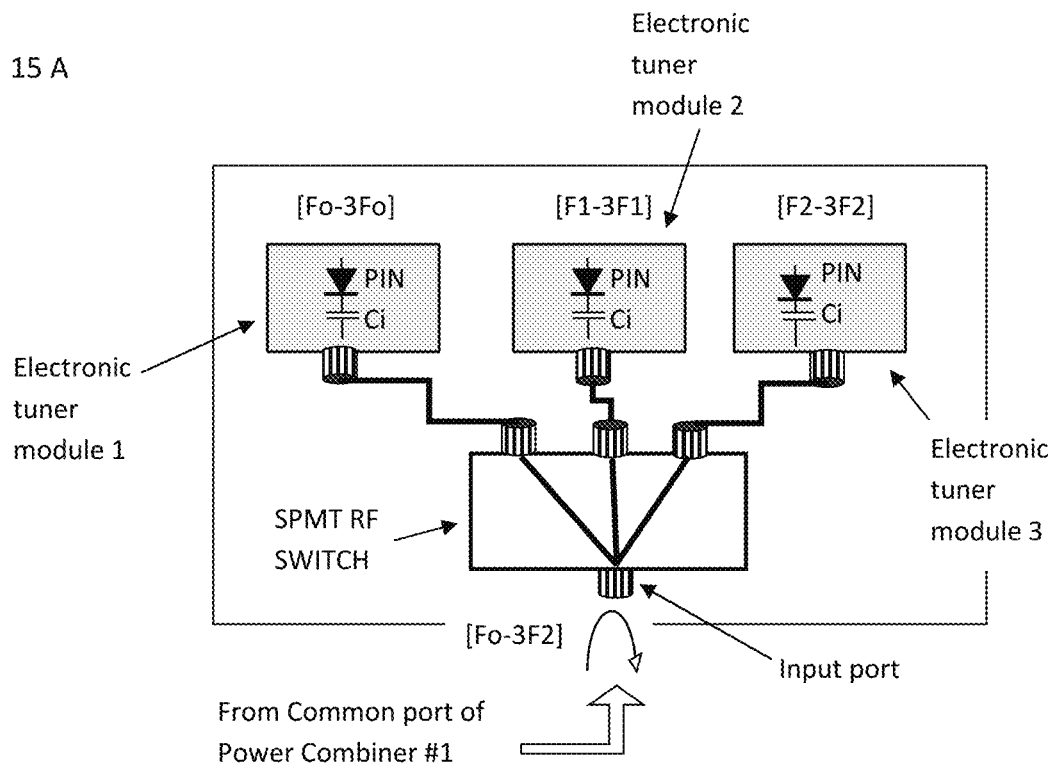
FIG. 15B: Prior art
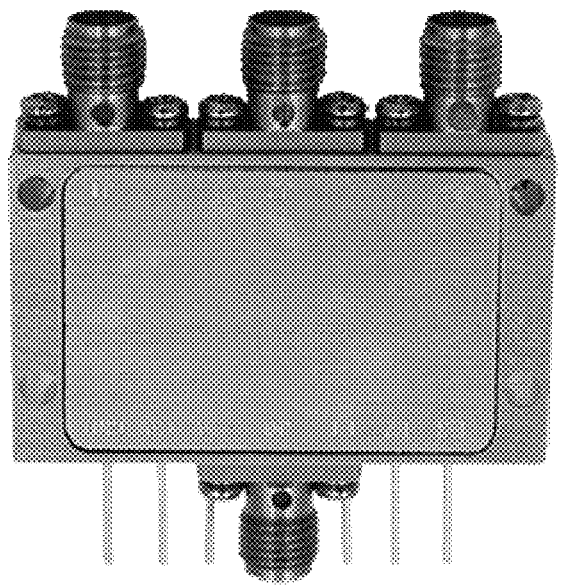

HARMONIC HYBRID ELECTRONIC LOAD PULL TUNER

PRIORITY CLAIM

This application claims priority on provisional application 62/772,829, titled "Harmonic Hybrid Electronic Load Pull Tuner", filed on Nov. 29, 2018.

CROSS-REFERENCE TO RELATED ARTICLES

1. "A New Load-pull Characterization Method for Microwave Power Transistors," Y. Takayama, [online], 1976 IEEE Microwave Theory & Techniques Society (MTT-S) International Microwave Symposium, pp. 218-220. [Retrieved on 2017 Apr. 6]. Retrieved from Internet <URL: http://ieeexplore.ieee.org/document/1123701/>.
2. "ALPS-308, Active Load Pull System for PCN Applications", Product Note 33, Focus Microwaves, April 1966, page 3, FIG. 3.
3. "Computer-Aided Error Correction of Large-Signal Load-Pull Measurements", TUCKER, R. S. and BRADLEY P., [online], IEEE Transactions on Microwave Theory and Techniques, vol. MTT-32, No. 3, March 1984, pp. 296-300. [Retrieved 2017 Apr. 6]. Retrieved from Internet <URL:http://ieeexplore.ieee.org/document/1132668/>.
4. "Comparison of Active Versus Passive On-wafer Load-pull Characterization of Microwave and Millimeter-wave Power Devices," J. E. Muller and B. Gyselinckx, [online], 1994IEEE MTT-S Digest, CH3389-4/94/0000-1007$01.00, pp 1007-1080, FIG. 1, [Retrieved 2017 Apr. 6]. Retrieved from Internet <URL: http://ieeexplore.ieee.org/iel5/11007886/00335168.pdf>.
5. "MPT a universal multi-purpose tuner", Product Note 79, Focus Microwaves, 2004.
6. "Multi Port Measurements", presentation by, D. Blackham and K. Wong, Agilent Technologies. Pages 3-8.
7. Verspecht, et al., U.S. Pat. No. 7,282,926, "Method and an apparatus for characterizing a high-frequency device-under-test in a large signal impedance tuning environment".
8. Tsironis, C. "U.S. Pat. No. 9,921,253, "Method for reducing power requirements in active load pull system," FIG. 12.
9. "Overcoming nonlinear measurement challenges", Application Note, Tektronix corporation.
10. "Wilkinson Power Divider PD-0109", Data Sheet [online], Marki Microwave [retrieved on 2018 Nov. 14], Retrieved from Internet <URL: https://www.markimicrowave.com/Assets/datasheets/PD-0109.pdf>.
11. Woodin C. et al., U.S. Pat. No. 5,276,411, "High power solid state programmable load".
12. Tsironis, C. U.S. Pat. No. 8,497,689, "Method for reducing power requirements in active load pull system".
13. "SP6T Electro-mechanical switch-Open Ports Terminated, model V3-7-L, Datasheet [online], Microwave Communications Laboratories, Inc. [retrieved on 2018 Nov. 14], Retrieved from Internet <URL: https://meli-.com/documents/V3-7-L.pdf>.
14. "Single Junction Circulators, D3C2080", Datasheet [online], Ditom Corp., [retrieved on 2018 Nov. 14], Retrieved from Internet <URL https://www.ditom.com/images/D3C2080.pdf>

BACKGROUND OF THE INVENTION

This invention relates to high power (nonlinear) testing of microwave transistors (DUT) using a load pull test setup as shown in FIG. 1: The transistor (DUT) 3 is inserted between two bi-directional couplers 11 and 10 and an input 2 and output 4 impedance tuner. The test signal is generated by a network analyzer 9, which serves also as signal wave receiver sampling small portions of the signal via the couplers 10 and 11; the signal is injected 1 into the input tuner 2. The main signal exiting from the DUT 3 is absorbed by a matched load 5 after passing through the output tuner 4; the whole is computer 6 controlled via digital cables 7 and 8. When the transistor is driven in its nonlinear operation regime, the internal impedance at the output of power transistors (DUT) is very low. An impedance tuner, used to conjugate power-match the transistor, must also physically match such impedance. Passive impedance tuners can reach maximum reflection factors $|\Gamma_{tuner}|$ the order of 0.95, corresponding to impedances of 2.4Ω, at their test port reference plane. The insertion loss of connections and cables, used between the DUT and the tuner, reduces the available tuning range at the DUT reference plane and thus the capacity of the passive tuner to match the transistor. The only remedy to this limitation is using active systems, i.e. test systems whereby a signal coherent (synchronous) with the signal injected into the transistor, is injected independently into the DUT output terminal and creates a virtual load. This additional signal can be the only one injected, in which case we speak of purely "active" load pull, or it can be superimposed (vector-added) to signal reflected by a passive tuner, in which case we speak of "hybrid" (active/passive) load pull; obviously if only a tuner is present, we speak of "passive" load pull. In both active injection and hybrid cases the objective is reaching and matching the conjugate complex internal impedance of the transistor; in general terms a standard requirement is a dynamic tuning range reaching a maximum reflection factor $|\Gamma|=1$ (corresponding to an internal impedance real part of 0Ω).

At high power the transistors become nonlinear, distort the sinusoidal signal and create harmonic signal components. These, if not matched and filtered properly, create distorted output signals and reduced intermodulation and power added efficiency. For adequate matching the harmonic signal components at the transistor (DUT) output one needs harmonic impedance tuners. There exist passive harmonic tuners (ref. 5) as well as pure active tuners (ref. 1) and hybrid ones (ref. 4). However active harmonic systems are cumbersome and, because they in general use frequency di- or triplexers (ref. 8), they are narrowband. Harmonic tuning made using wideband passive harmonic tuners (ref. 5) is slow, because of mechanical tuning probe movement. If harmonic tuning is made using controlled external sources, then high speed is possible, but at the price of a very complex and expensive setup (ref. 9).

This invention discloses a a) high speed, b) wideband hybrid harmonic tuner architecture, using a single source and allowing c) injection power savings and d) tuning range up to $|\Gamma|=1$.

DESCRIPTION OF PRIOR ART

There have been a number of active load pull systems, starting back in the 70'ies (ref. 1 to 4). Active load pull techniques use the so called "virtual load" method. The virtual load method consists in injecting into the output of the DUT RF power coherent signal at the same frequency as traversing the DUT from the input to the output, but with controlled phase and amplitude. Knowing that the reflection factor "seen" by the DUT is equal to the ratio of returned (normally "reflected") power wave <a> to primary output power wave <b> by: (r=<a>/<b>), it is understood that by controlling the phase and amplitude of the returned signal power <a> we can control r. There are a number of ways to do this: One is to use an "active load" technique (ref. 2). In this case part of the outgoing power $P_{out}$ is split into the coupled port of a directional coupler, filtered, phase-adjusted, amplified and re-injected into the output port of the DUT, which will "see" a complex "virtual" load r as described above. Another method is to use a split signal method (ref. 1) or two synchronized RF sources (ref. 3) one to inject RF power into the input of the DUT and one into its output. Since the sources are synchronized, they can generate a coherent signal and if we adjust the relative phases between sources and the amplitude of the second source, then the DUT will, again, see at its output port a "virtual" load r, as described earlier.

The basic idea on which the active tuner section of this invention is based upon is the "active load" feedback injection technique (FIG. 3 in ref. 2). In ref. 2 a fixed coupler samples part of the fundamental frequency of the outgoing signal, adjusts (modulates) its phase and amplitude, amplifies it and injects it back towards the DUT. In the context of this invention the coupler itself is statically, amplitude and phase adjustable. Dynamic adjustment of the phase and amplitude of the feedback injected signal is not through a fundamental frequency phase shifter and amplitude modulator, it is instead through a high-speed reflection on a harmonic electronic tuner through a power combiner. The schematics of a prior art wideband electronic tuner is shown in FIG. 4. A power combiner/divider is a three-port passive reciprocal device (FIG. 12A, 12B), which can be used to combine signals from two input ports into one output port, or divide equally signal entering into the common port (above named output port) into two output ports (above named input ports). The definition input or output ports in a reciprocal device is related to the specific use as combiner or divider. Such combiner is used in this invention instead of a more signal efficient (having less insertion loss) circulator, for the simple reason that, non-reciprocal, circulators are mostly octave band limited and cover only exceptionally up to 2 octaves (Fmax:Fmin=4:1, ref. 14, FIG. 16) and would only allow restricted harmonic tuning with Fmin≤Fo≤1.66*Fmin. Power dividers instead are a viable alternative offering multi-octave wideband operation and allow wideband up to 3 harmonic frequency handling (example ref. 10: 1 to 9 GHz coverage corresponds to 3 harmonic tuning capability with fundamental frequency operation from 1 to 3 GHz).

The passive harmonic tuner used in the present system (FIG. 7 to 9 and 16) has a pre-tuning (or pre-matching) function at the fundamental and the harmonic frequencies. Purely active systems (without passive tuners, FIG. 6) suffer from the natural mismatch between the output impedance of the feedback power amplifier ($Z_{PA}$=50) and the internal impedance of the DUT ($Z_{out}$≈1-2Ω). An inserted pre-matching tuner (i.e. a transformer) brings both sides closer together to around 7Ω. This, considering also the limiting loss of the tuner, saves around 10 dB in feedback power requirement. A harmonic tuner accomplishes this task for all three harmonic frequencies simultaneously. In short: Instead of tuning around 50Ω, the hybrid system tunes around 5-7Ω (|Γ|≈0.5-0.7) with much higher efficiency (FIGS. 13 and 14).

BRIEF DESCRIPTION OF THE SEVERAL VIEWS OF THE DRAWINGS

The invention and its mode of operation will be more clearly understood from the following detailed description when read with the appended drawings in which:

FIG. 1 depicts prior art, a load pull system with in-situ power wave measurement using bidirectional couplers.

FIG. 2 depicts prior art, a compact directional signal coupler using a magnetic loop in form of folded semi-rigid coaxial cable, ("wave-probe", ref. 7).

FIGS. 3A through 3B depict bidirectional wave-probe coupler and data; FIG. 3A depicts coupling and isolation of a wave-probe coupler as a function of frequency; FIG. 3B depicts coupler port and signal flow definitions.

FIG. 4 depicts prior art, schematics of an electronic digital tuner (ref. 11).

FIG. 5 depicts prior art, control of coupling factor of a wave-probe as a function of inserting and withdrawing the magnetic coupling loop into the slabline.

FIGS. 12A through 12B depict a power divider/combiner and use in the tuner; FIG. 12A depicts a photograph of a commercially available 1-9 GHz combiner and signal flow; FIG. 12B depicts transfer ($S_{in-out}$) and isolation ($S_{in-in}$) typical data.

FIGS. 13A through 13C depict prior art: calibration/tuning points of electronic/digital tuner at 3 harmonic frequencies; FIG. 13A at Fo, FIG. 13B at 2 Fo and FIG. 13C at 3 Fo.

FIGS. 15A through 15B depict alternative wideband electronic tuner configuration. FIG. 15A depicts the concept of switchable medium band electronic tuners allowing large frequency coverage from Fo to 3F2 (example Fo=1 GHz, 3F2=9 GHz, 3+ octaves); FIG. 15B depicts prior art: commercially available wideband single pole triple- (or multi-) throw (SP3T) remotely controlled electromechanical wideband switch (ref. 13).

DETAILED DESCRIPTION OF THE INVENTION

Figure 6:
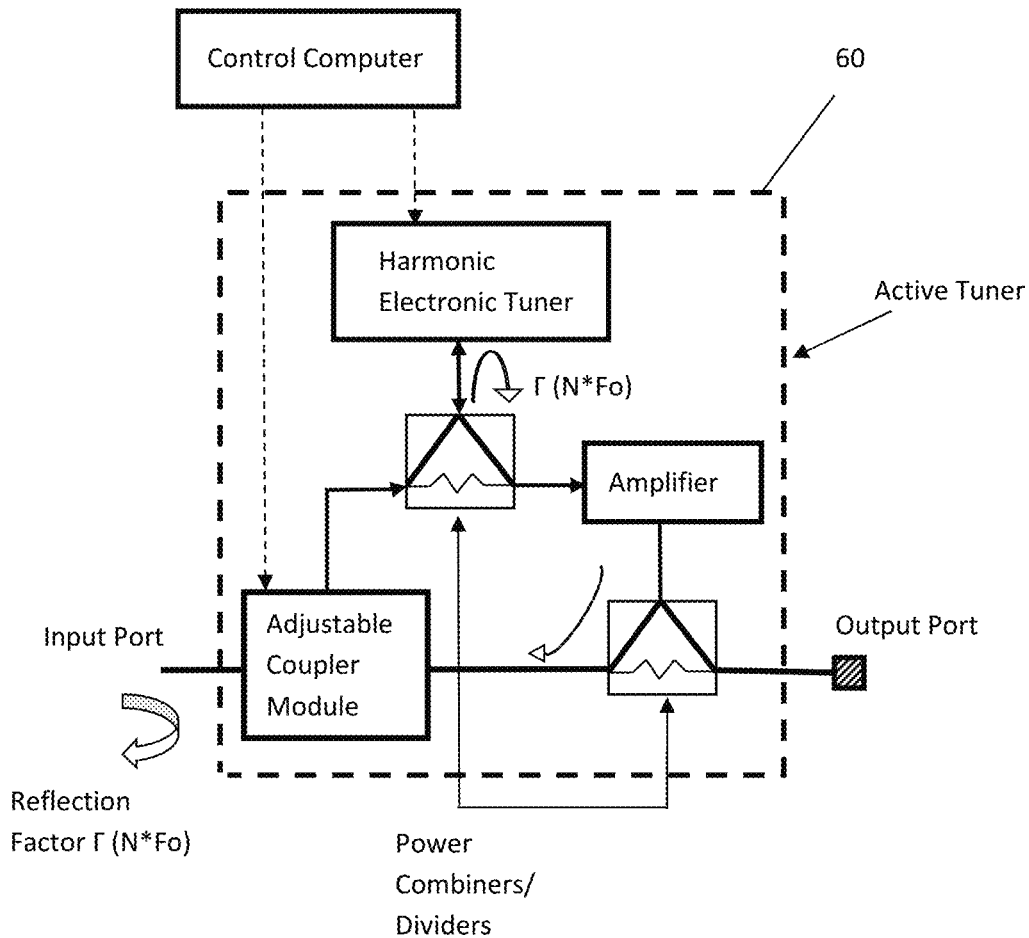
FIG. 6 depicts schematics of high-speed wideband active loop tuner.
Figure 7:
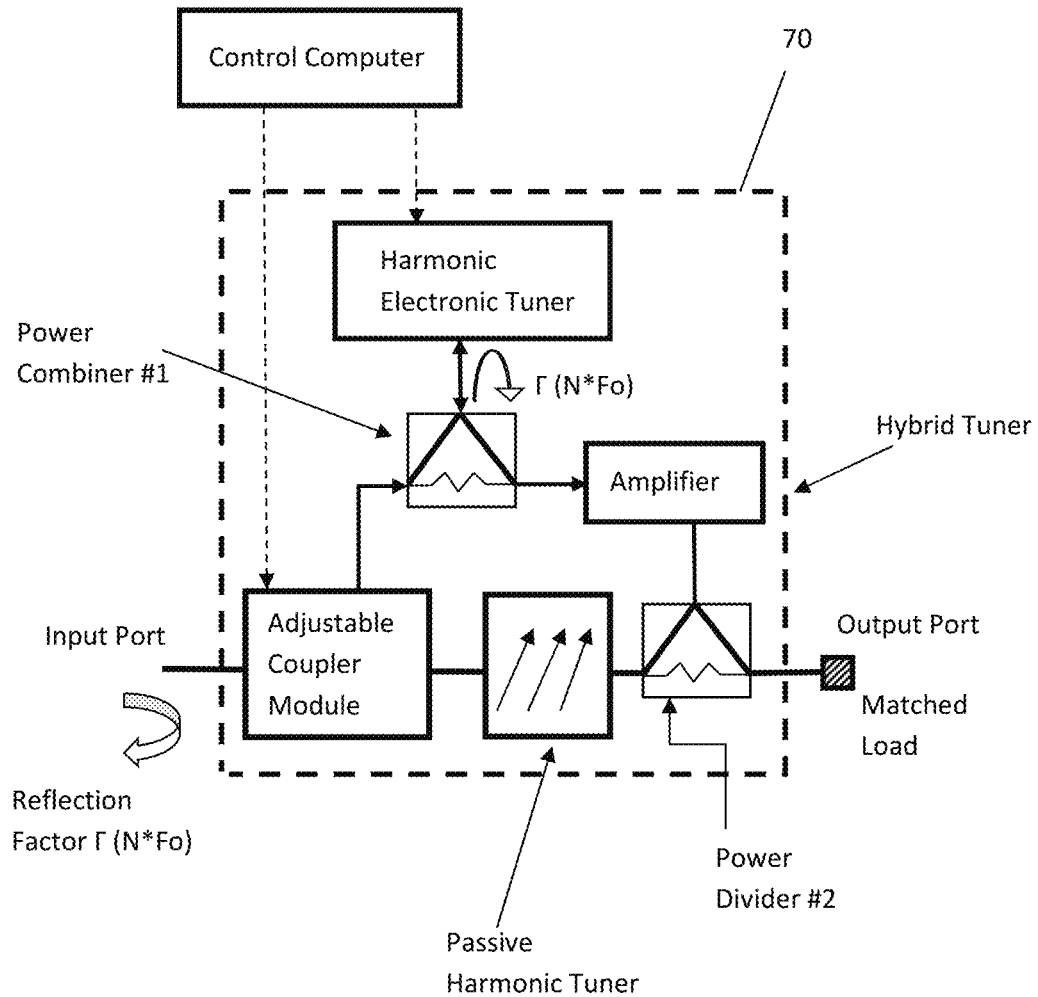
FIG. 7 depicts schematics of high-speed harmonic wideband hybrid tuner.
Figure 8:
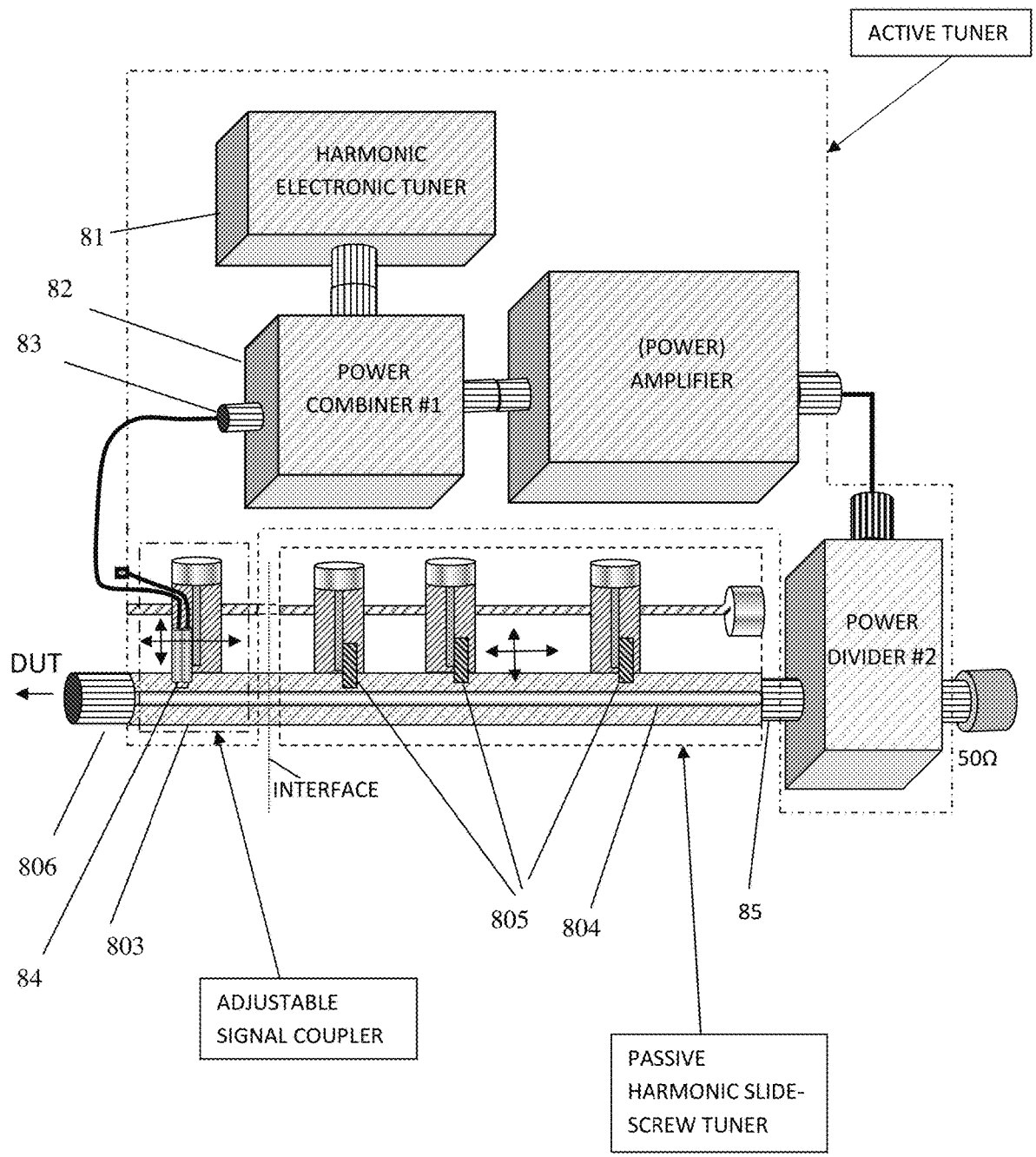
FIG. 8 depicts representative layout of high-speed harmonic wideband hybrid tuner.
Figure 9:
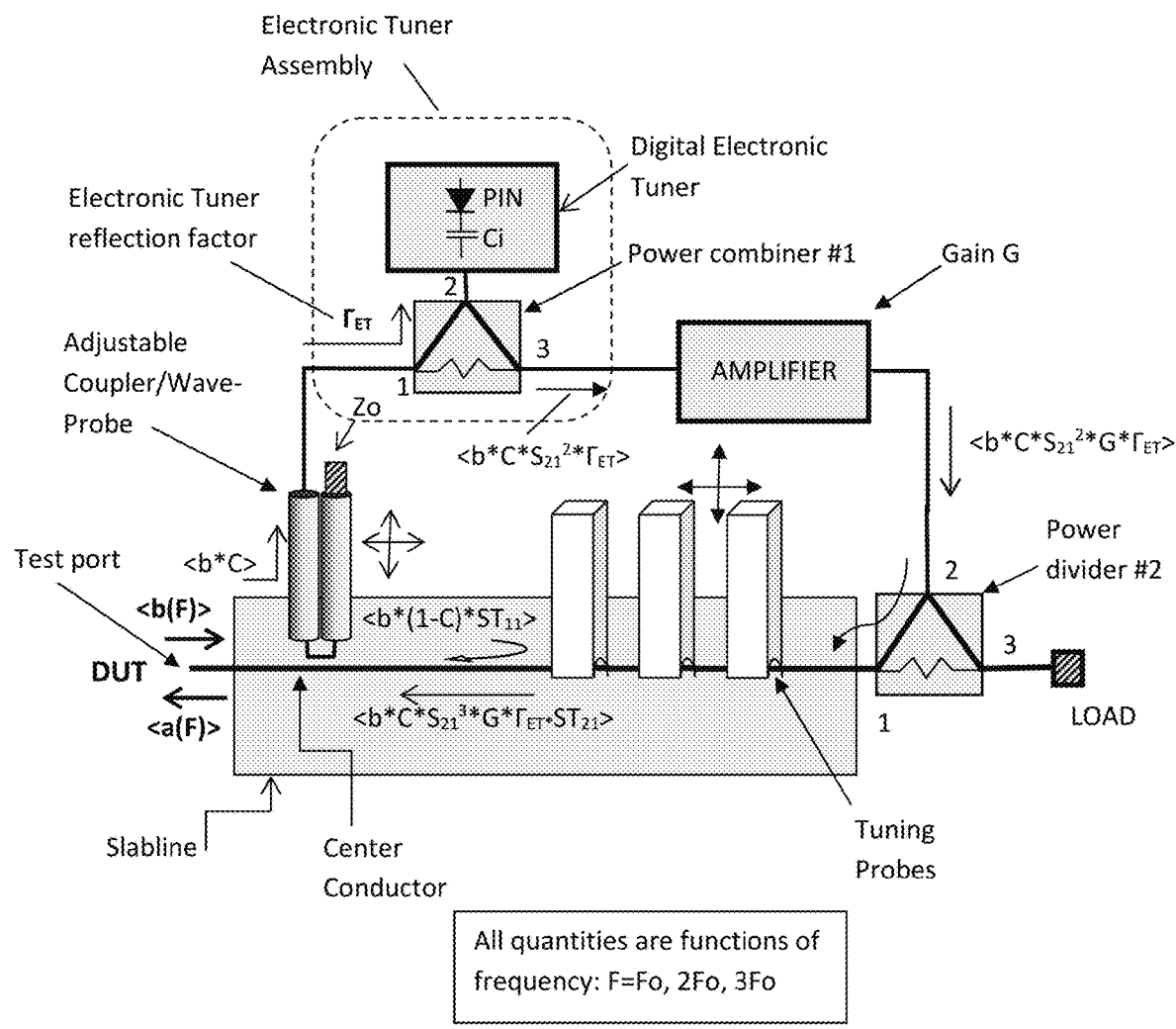
FIG. 9 depicts representative layout of high-speed harmonic wideband hybrid tuner and associated approximate signal flow relations.

The concept of the hybrid high speed tuner is shown in FIG. 6 to 9. FIG. 6 shows the fundamental (Fo) single frequency configuration, whereas FIG. 7 to 9 show the harmonic configuration. In a single housing 60, 70, and using the same low loss slotted airline (slabline) 803 there are integrated two sections: (1) the passive slide screw tuner section and (2) the active tuner section; the passive tuning section comprises the major part of the slabline 803 with the center conductor 804 which reaches from the test 806 to the idle 85 port and at least two horizontally movable carriages carrying vertically adjustable reflective tuning probes 805 and the associated horizontal and vertical stepper motors, precision vertical axes and lead screws, all remotely controlled; the motors and gear control the penetration of the probes inside the slabline slot, and by that the amplitude of the reflection factor, and they also control, independently, the horizontal positions of the carriages and by that the phase of the reflection factor (ref. 5).

The active tuner section joins the passive tuner section at the interface between the output port of the adjustable (FIG. 5) coupler and the input port of the passive tuner, ideally by sharing the same slabline with the passive tuner, in the area close to the test port 806. The active tuner section comprises (a) the adjustable coupling module (signal coupler-wave-probe 84, FIG. 2, 8), (b) the power combiner #1, 82, (c) the harmonic electronic/digital tuner 81 or the assembly comprising the SP3T switch with up to 3 electronic tuners (FIG. 15A, 15B), (d) the power amplifier (the term "power" is optional and in brackets, because it is a vague expression: "power" can be 1 W or it can be 100 W, depending on the environment, typically when the non-saturated output power of an amplifier is at least 30 dBm (1 W) or higher, we speak of a "power amplifier"), and (e) the output power divider #2, used for re-injecting the amplified signal towards the test port 806 and the DUT. The power combiners/dividers #1 and #2 are chosen instead of circulators or signal couplers because they offer the best compromise between coupling factor (3 dB) and bandwidth (1 decade or more). Circulators have highest coupling but only 1 octave or less bandwidth, especially below 1 GHz, and wideband couplers have less coupling (−10 dB or less) leading to extreme high output power requirement from the amplifier; in either case harmonic tuning is non or quasi-non feasible. "Quasi" applies to border cases where we have only two-harmonic tuning Fo and 2 Fo and the selected circulator covers exactly 1 octave between Fo and 2 Fo; such circulators are available only above 1 GHz. Such a load pull system would, though, not be universally useable.

Figure 16:
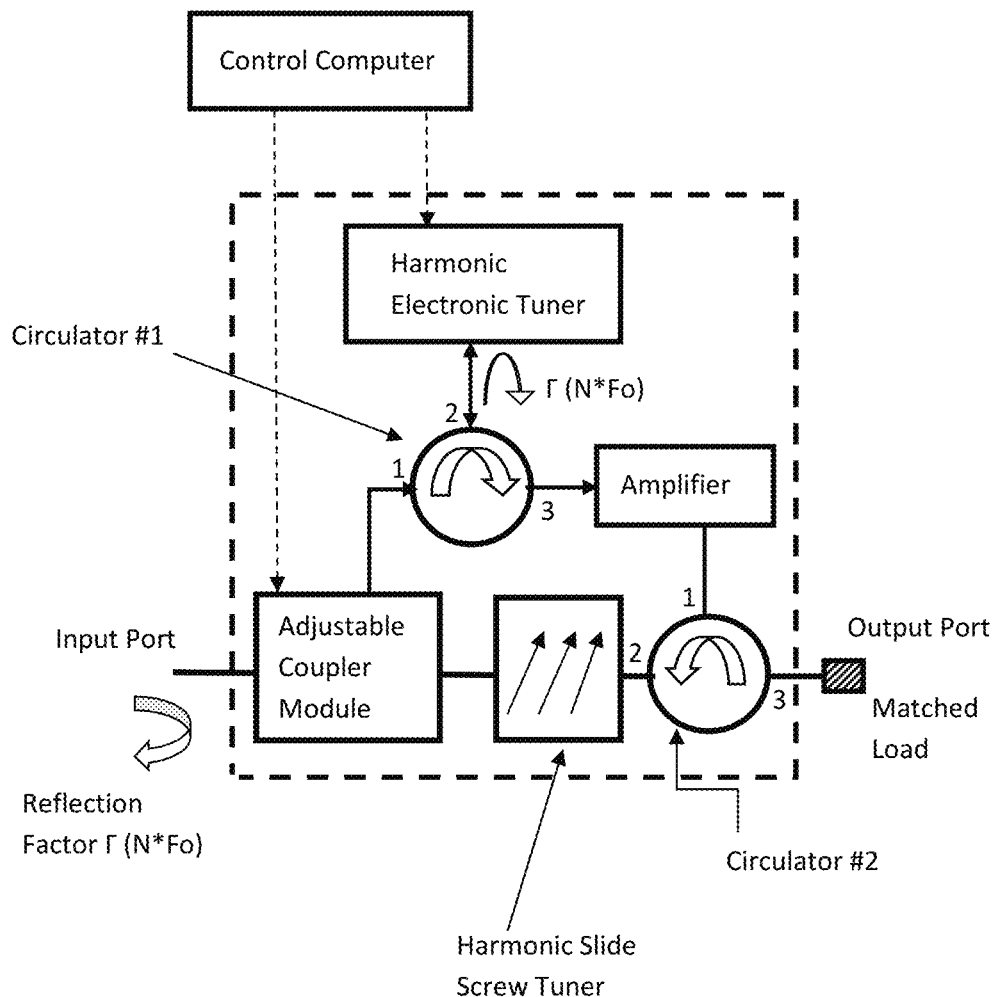
FIG. 16 depicts schematics of high-speed wideband hybrid tuner using wideband circulator instead of combiner.

In particular, the preferred embodiment is using wideband combiner/divider #2 (FIG. 7) which has 3 dB coupling (ref. 11). Obviously a low loss circulator #2 as shown in FIG. 16, would be a better solution regarding power transfer, allowing about 95% of the power delivered by the power amplifier to be transferred, instead of 50% delivered by the 3 dB combiner #2, but it is excluded, because circulators are bandwidth-limited to a maximum of 1 octave (Fmax: Fmin=2:1), thus not allowing for real harmonic tuning, where bandwidths of at least two or three octaves (Fmax: Fmin=8:1) or one decade (Fmax:Fmin=10:1) are needed. Of course, the question arises, why not connect the power amplifier directly to the idle port 85 (FIG. 8) and recover the whole power? The reason is that the output of power amplifiers must be protected from very high reflection and backlash of power, which may lead to destruction of the amplifier. A 3 dB combiner/divider ensures at least 6 dB return loss (or 25% maximum reflection), which is considered safe for a typical power amplifier. Throughout this invention power combiners/dividers are physically identical (FIG. 12A), and are used and called according to their position in the network. They are called either combiners or dividers accordingly. The non-common ports are called "Input" or "Output" ports dependently if they mainly receive or deliver signal power.

The 1 octave (Fmax:Fmin=2:1) limited bandwidth of circulators is also the reason for using wideband power combiner #1 in association with the harmonic electronic tuners 81, despite the fact that half the reflected power at the electronic tuners is lost going back the path 83 of the wave-probe 84. This loss is easily compensated by a commonly available higher gain power amplifier. The signal coming back from the electronic tuner towards port 83 is weakened by the at least 6 dB (typically 7 to 8 dB, FIG. 12B) return loss of the power combiner 82 and, further-on by the weak coupling factor (typically −20 dB) of the wave-probe coupler 84. The amplitude and phase adjustable coupler 84 serve in adjusting the total sampled and re-injected power and the static orientation (vector angle) of the overall tuning cluster of reflection factors 100 (FIG. 10) at the fundamental frequency.

The carriages of the passive tuner, the wave-probe coupling magnetic loop 84 and their vertical axes with the attached tuning probes 805 are remotely adjusted by lead and precision screws and other suitable gear, and driven by electrical (stepper) motors, which are controlled electronically using control boards, processors and appropriate control software. FIG. 3A depicts forward coupling S31 and isolation S32 of the compact signal coupler (wave-probe, ref. 7) shown in FIG. 2 as defined in FIG. 3B. The difference (directivity) of over 10 dB for a simple uncompensated structure shows the utility of the device. The coupling factor itself is adjustable by controlling the distance between the center conductor 20 and the coupling loop 21, through the vertical movement 22 of the vertical axis. This allows adjusting the attenuation of the active tuner section. The phase is adjusted by the horizontal position of the carriage holding the wave-probe 21.

FIG. 9 outlines, schematically, the major power wave flow and associated interactions. The frequency dependent signal power wave <b(F)> is delivered by the DUT to the test port of the tuner. A small part of it, <b*C>, is extracted, coupled through the coupling factor C of the adjustable coupler and injected into the electronic tuner assembly; the signal <b*C> enters at port 1 and exits at port 3 of the power combiner #1 and is <b*C*S21$^2$*Γ$_{ET}$> and the remaining portion <b*(1−C)> is injected and reflected back by the passive tuner in the slabline, leading to a load reflection factor contribution of <b*(1−C)*S11T>, wherein S11T is the reflection factor of the passive tuner at the associated frequency. The electronic tuner reflects the coupled signal <b*C*S21> by its reflection factor Γ$_{ET}$ at port 2 of combiner #1. The returning signal is split equally between ports 1 and 3: <b*C*S21*Γ$_{ET}$*S32> or <b*C*S21$^2$*Γ$_{ET}$>, since S21 and S32 can be assumed to be quasi equal. The signal exiting from port 3 of combiner #1 is amplified by the (power) amplifier by the gain factor G and injected into the common port 2 of power combiner #2; the exiting signal <b*C*S21$^3$*G*Γ$_{ET}$> from port 1 of combiner #2 is injected into the slabline through the idle port 85 (FIG. 8), whereas the other half is absorbed by the load et port 3. In all this the transfer factor between each of the input/output ports and the common port of either combiner/divider is assumed to be equal to S21, which is a fair assumption. After that the signal is transferred to the DUT at the test port 806 via the pre-matching tuner, whose three-probe combined transfer scattering parameter is ST21 (different at each frequency and tuner setting): <a>≈<b*{(1−C)*ST11+C*S21$^3$*G*ST21*Γ$_{ET}$}> leading to a hybrid load reflection factor Γ$_{LOAD}$=<a>/<b>≈(1−C)*ST11+ C*S21$^3$*G*ST21*Γ$_{ET}$; given S21=0.707 (−3 dB) it is obvious that proper choice of C and G will ensure Γ$_{LOAD}$ values up to 1. With typical values ST11≈0.7, ST21≈0.4, C≈0.1(−20 dB), $\Gamma_{ET}$=0.5 we obtain, for |$\Gamma_{LOAD}$|=1, a required minimum gain of the amplifier of G≥18 dB (=63 in linear), an easily available power amplifier capacity. This simplified calculation applies for each harmonic frequency and ignores phase imbalance and a number of spurious effects like multiple reflections, signal leakage, etc. but is sufficient to show that the apparatus is feasible using readily available components.

Figure 11:
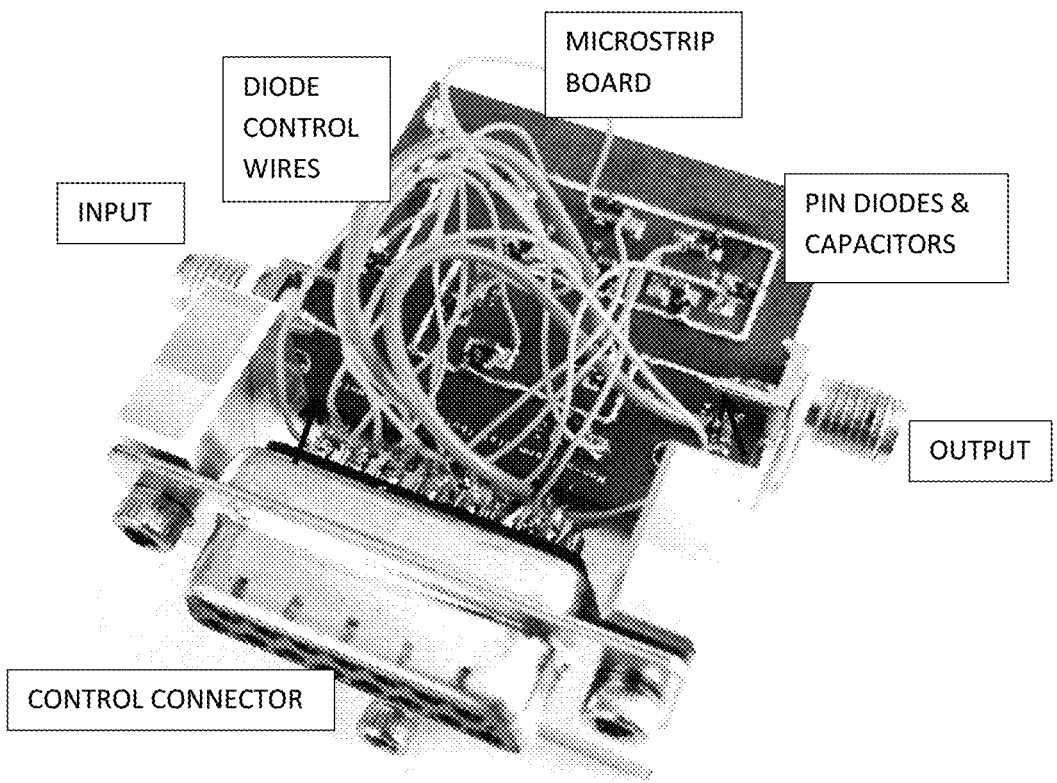
FIG. 11 depicts a photograph of electronic digital tuner prototype.

The difference between a single frequency and a harmonic electronic tuner module lies in the number of states. All wideband tuners create reflection factors (impedances) at all frequencies, including harmonic frequencies. The difference between a simple wideband tuner and a harmonic tuner is that the harmonic tuner can set the impedances at the fundamental and the harmonic frequencies at will, whereas the simple wideband tuner can do this only at the fundamental frequency while the impedances at the harmonic frequencies are uncontrolled. An electronic tuner module (FIG. 11), as described here, is digital. The PIN diodes are switched individually between ON (through line) and OFF (open circuit). In such a configuration the number of discrete tuner states is M=$2^N$, whereby N is the number of diodes. Experience with harmonic slide screw tuners (ref. 5) shows that for efficient harmonic tuning one needs several millions of tuner states per frequency. To obtain 16,000,000 electronic tuner states one needs 24 capacitor-diode blocks ($2^{24}$=16,777,216). This can be obtained by cascading two tuner units with 12 capacitor-diode blocks (4096 states) each. The insertion loss of the first electronic tuner unit will reduce the overall reflection factor, but in view of easily obtainable high Gain amplifiers, as discussed before, this can be tolerated.

Figure 10:
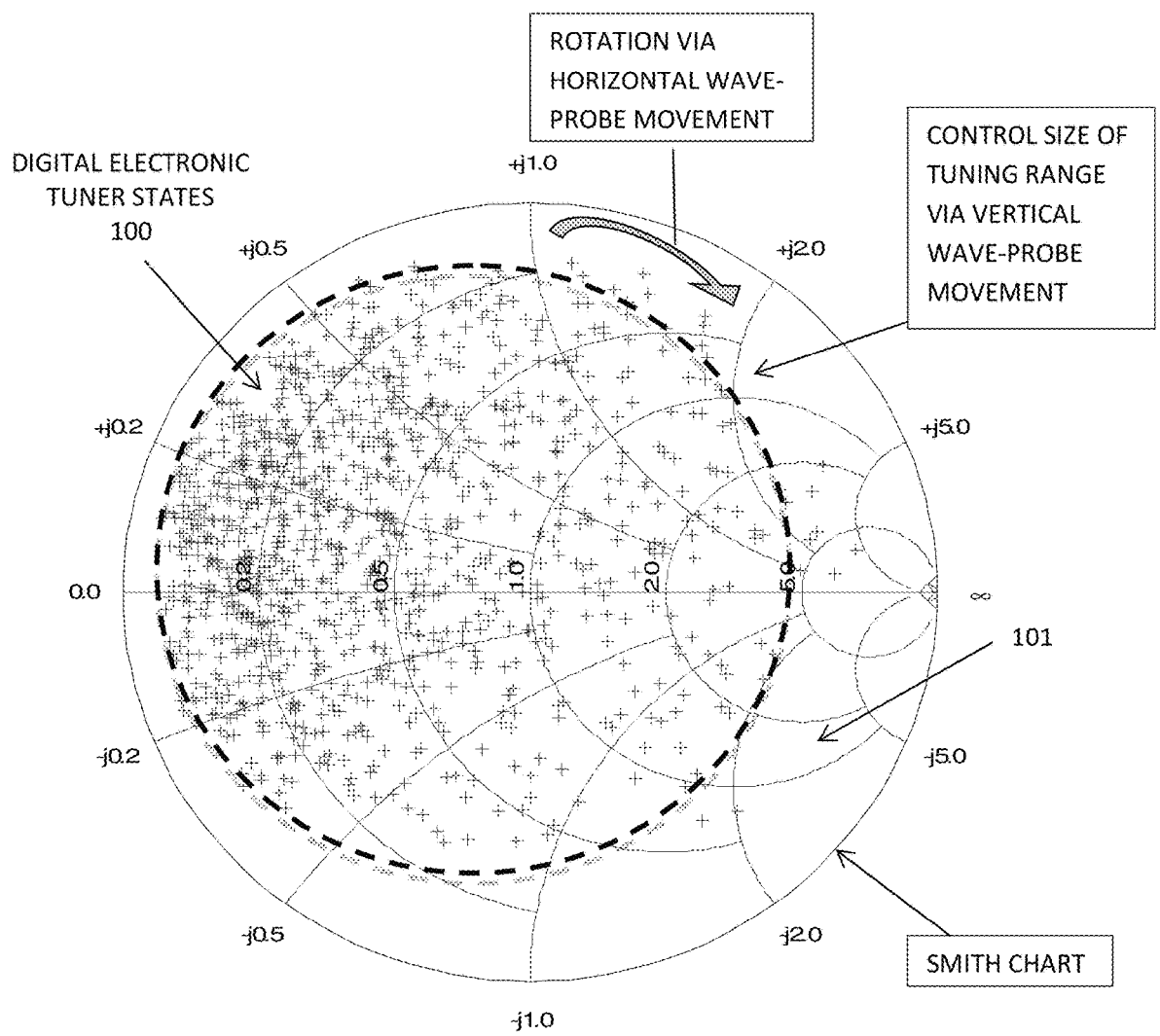
FIG. 10 depicts calibration and tuning points, seen at the tuner test port at a fundamental frequency using relatively weak passive pre-tuning.

The resulting electronic tuning pattern of the hybrid tuner at the test port in FIG. 9 for a single frequency is shown in FIG. 10. It is shown for an initialized passive tuner (all tuning probes 805 withdrawn from the slabline 803). The irregular point distribution is typical for the electronic tuner (FIG. 5 in ref. 11,) and varies with frequency (FIG. 13). The phase and amplitude of the coupling factor of the adjustable coupler 84 allow changing the surface coverage 100 and the direction of the tuning area in the Smith chart. This way tuning in a certain area up to |Γ|≈1 becomes possible. The active system has the advantage, compared with the passive system, that, for frequencies other than the operation frequency, the reflection factor presented to the DUT is low; this reduces the risk of spurious oscillations. However, the active system must be handled with care, since, exceeding in =1 often destroys the DUT. Of course, this risk can be reduced or completely avoided with careful tuning control algorithms. The other disadvantage of the purely active system, the requirement for high power feedback amplifiers (ref. 12) though, remains. The need of, sometimes, extreme high-power microwave amplifiers, makes such systems either financially challenging or unfeasible.

Figure 14:
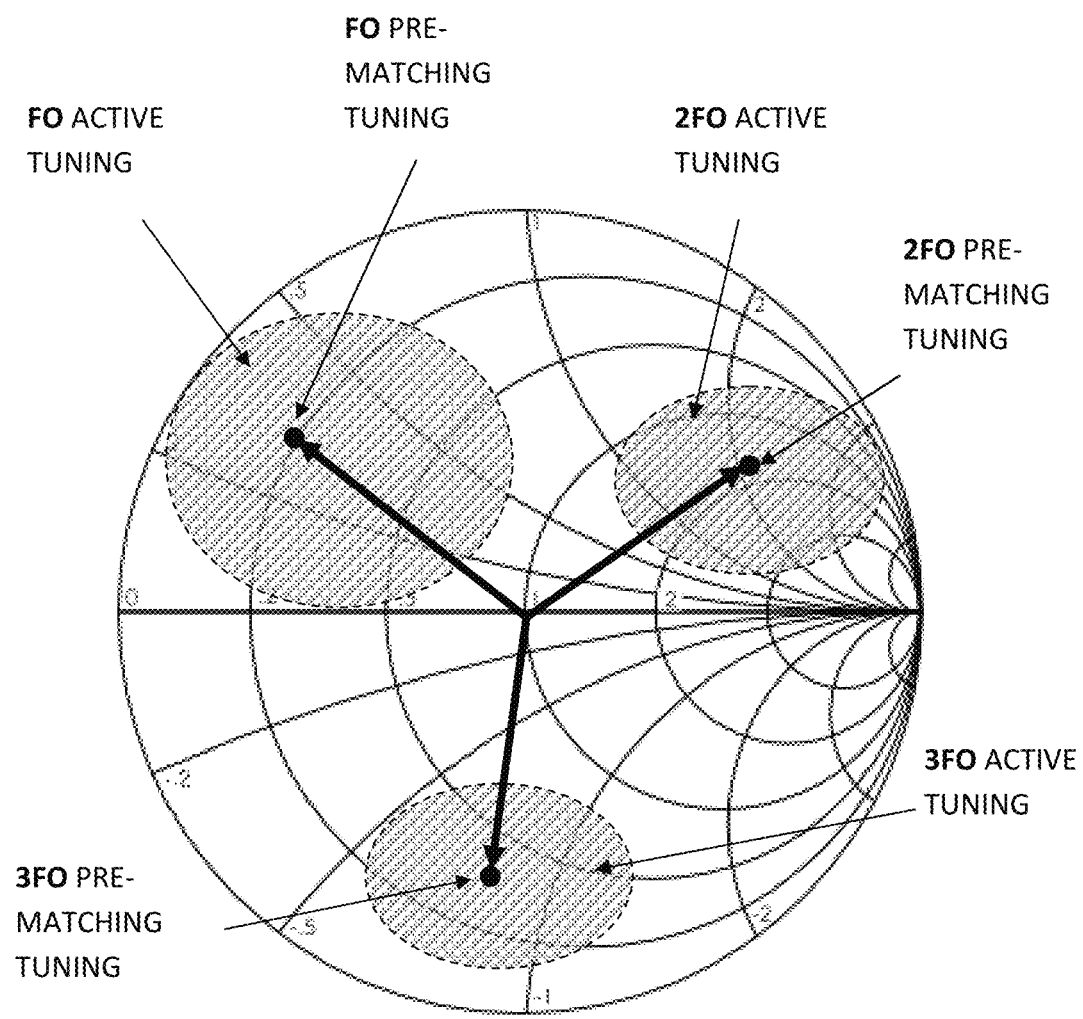
FIG. 14 depicts schematic tuning points of harmonic hybrid tuner at Fo, 2 Fo and 3 Fo using relatively strong passive pre-tuning at all harmonics.

Most of the above can be alleviated when we use a hybrid harmonic system. (FIG. 7 to 9). The multi-probe passive harmonic tuner (ref. 5) allows two major things: 1) it helps reducing the power requirement of the feedback amplifier for all frequencies; 2) it allows static pre-tuning in any area of interest on the Smith chart (FIG. 14) the pre-tuning vectors can be changed at will, within the feasible and recommended range and at any angle for each frequency (Fo, 2 Fo and 3 Fo). Multi-harmonic tuning systems are feasible for bandwidths exceeding all electronic tuning combinations, even those obtainable by combining electronic tuners using switches (FIG. 15). The pre-tuning shown in FIG. 14 allows reducing feedback power and allows high speed tuning in focused areas. By increasing the amplitude of the pre-tuning vector shrinks the tuning area. If a complete coverage of the Smith chart by electronic tuning is required the associated harmonic passive pre-matching vector |Γ(N*Fo)| can be set individually to zero.

Although the invention has been disclosed as an integrated device, comprising an active tuner section and a passive tuner section (FIG. 8), their individual operation can be independent. The active section can be separated from the passive section and housed in a separate enclosure. The active section unit then comprises the variable signal coupler 84, the two power combiners/dividers, the electronic/digital tuner and the amplifier. It is connected with the passive tuner section using the variable coupler, which, in an optimum embodiment, shares the same slabline as the passive tuner and one output port of the output power combiner #2. The advantage of the presented solution is that the active tuner unit can be added to existing passive tuner units to enhance their tuning range and allow high speed electronic tuning.

Active injection networks cannot be pre-calibrated for full power operation, i.e. their measured s-parameters cannot be used with high accuracy under all test conditions, specifically under high power. The reason is that the feedback amplifier will become nonlinear above certain power level, causing a Gain change or a phase distortion, in which case the calibration data drift. Such networks shall be used in load pull networks with on-line wave measurement capability (FIG. 1, ref. 6). In this case the incident <b> and reflected <a> power waves at the DUT ports, are measured using bi-directional couplers and corrected to the DUT reference plane using setup calibration (ref. 6).

Obvious alternative embodiments can be imaginable but shall not be construed to impede on the originality of the idea of integrating (i) a slabline-based phase and amplitude adjustable signal coupling device, (ii) a harmonic electronic tuner and (iii) two power combiners/dividers to create a (a) high-speed, (b) wideband, (c) hybrid and (d) harmonic load pull tuner, without using external signal sources.

What I claim is:

1. A hybrid (active/passive), harmonic load pull tuner comprising:
    a passive harmonic impedance tuner, and
    an active harmonic impedance tuner;
    wherein the passive harmonic impedance tuner comprises
        a low loss slotted airline (slabline) having a test port, an idle port, a center conductor between the ports and up to three independently and remotely controlled sliding carriages positioned along a longitudinal slabline axis, each said carriage including at least one remotely controlled vertical axis, each said remotely controlled vertical axis carrying a wideband reflective tuning probe insertable into the slot of the slabline and capacitively coupled with the center conductor;
    and wherein the active harmonic impedance tuner comprises;
        an adjustable signal coupler (ASC) having input, output, coupled and isolated ports, two power combiners/dividers #1 and #2 each having two input/output ports and one common port, a harmonic digital electronic impedance tuner having an input port and an output port and creating a multitude of remotely controlled reflection factors, and a power amplifier having an input and an output port;
    wherein the adjustable signal coupler (ASC) is inserted between a device under test (DUT) and the test port of the passive harmonic impedance tuner, the coupled port of the ASC is connected with one input/output port of power combiner/divider #1, the common port of power combiner/divider #1 is connected with the input port of the harmonic digital electronic impedance tuner, the output port of the harmonic digital electronic impedance tuner is terminated with a passive load, the other input/output port of power combiner/divider #1 is connected with the input port of the power amplifier, the output port of the power amplifier is connected with the common port of power combiner/divider #2, one input/output port of power combiner/divider #2 is connected with the idle port of the slabline, the other input/output port of power combiner/divider #2 is terminated with a matched load.

2. The hybrid harmonic load pull tuner of claim 1, wherein the harmonic digital electronic impedance tuner comprises at least two digital electronic impedance tuner modules, each having an input port and an output port, and wherein the output port of each digital electronic impedance tuner module is terminated with a passive load, and wherein each digital electronic impedance tuner module generates a multitude of remotely controlled reflection factors over an at least one octave wide frequency band, and wherein the input ports of the digital electronic impedance tuner modules are connected with the output ports of a single pole multi-throw (SPMT) remotely controlled wideband RF switch, and wherein the input port of the RF switch is connected with the common port of power combiner/divider #1.

3. A hybrid (active/passive), harmonic load pull tuner comprising:

a passive harmonic impedance tuner, and an active harmonic impedance tuner;

wherein the passive harmonic tuner comprises:

a low loss slotted airline (slabline) having a test port, an idle port, a center conductor between the ports and up to three independently and remotely controlled sliding carriages positioned along a longitudinal slabline axis, each said carriage including at least one remotely controlled vertical axis, each said remotely controlled vertical axis carrying a wideband reflective tuning probe insertable into the slot of the slabline and capacitively coupled with the center conductor;

and wherein the active harmonic impedance tuner comprises:

an adjustable signal coupler (ASC) having input, output, coupled and isolated ports, two circulators #1 and #2, each having three ports 1, 2 and 3, a harmonic digital electronic impedance tuner having an input port and an output port and creating a multitude of remotely controlled reflection factors, and a power amplifier having an input and an output port;

wherein the adjustable signal coupler (ASC) is inserted between a device under test (DUT) and the test port of the passive harmonic impedance tuner, the coupled port of the ASC is connected with port 1 of the circulator #1, port 2 of the circulator #1 is connected with the input port of the harmonic digital electronic impedance tuner, the output port of the harmonic digital electronic impedance tuner is terminated with a passive load, port 3 of the circulator #1 is connected with the input port of the power amplifier, the output port of the power amplifier is connected with port 1 of the circulator #2, port 2 of the circulator #2 is connected with the idle port of the slabline, port 3 of the circulator #2 is terminated with a matched load.

4. The hybrid harmonic load pull tuner of claim 1 or 3, wherein the adjustable signal coupler (ASC) comprises a magnetic loop, insertable into a slot of the slabline, coupled electromagnetically with the center conductor, and attached to a mobile vertical axis of a carriage movable along the axis of the slabline.

5. The hybrid harmonic load pull tuner of claim 4, wherein the carriage and its vertical axis controlling the magnetic loop are manually controlled using appropriate gear.

6. The hybrid harmonic load pull tuner of claim 4, wherein the carriage and its vertical axis controlling the magnetic loop are remotely controlled using stepper motors and appropriate gear.

7. The hybrid harmonic load pull tuner of claim 3, wherein the harmonic digital electronic impedance tuner comprises at least two digital electronic impedance tuner modules, each having an input port and an output port, and wherein the output port of each digital electronic impedance tuner module is terminated with a passive load, and wherein each digital electronic impedance tuner module generates a multitude of remotely controlled reflection factors over an at least one octave wide frequency band, and wherein the input ports of the digital electronic impedance tuner modules are connected with the output ports of a single pole multi-throw (SPMT) remotely controlled wideband RF switch, and wherein the input port of the RF switch is connected with port 2 of circulator #1.

8. The hybrid harmonic load pull tuner of claim 2 or 7, wherein the frequency bands of the digital electronic impedance tuner modules are adjacent.

9. The hybrid harmonic load pull tuner of claim 2 or 7, wherein the frequency band of each digital electronic impedance tuner module covers at least two octaves.

* * * * *